United States Patent
Fuse et al.

(10) Patent No.: US 10,784,127 B2
(45) Date of Patent: Sep. 22, 2020

(54) METHOD OF ADJUSTING MEASUREMENT POSITION OF RADIATION THERMOMETER AND HEAT TREATMENT APPARATUS

(71) Applicant: SCREEN HOLDINGS CO., LTD., Kyoto (JP)

(72) Inventors: Kazuhiko Fuse, Kyoto (JP); Shinji Miyawaki, Kyoto (JP); Takahiro Kitazawa, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 285 days.

(21) Appl. No.: 15/905,275

(22) Filed: Feb. 26, 2018

(65) Prior Publication Data
US 2018/0269085 A1    Sep. 20, 2018

(30) Foreign Application Priority Data
Mar. 17, 2017    (JP) .................................. 2017-052635

(51) Int. Cl.
*H01L 21/26*    (2006.01)
*H01L 21/324*    (2006.01)
(Continued)

(52) U.S. Cl.
CPC ...... *H01L 21/67115* (2013.01); *G01J 5/0007* (2013.01); *G01J 5/0205* (2013.01);
(Continued)

(58) Field of Classification Search
None
See application file for complete search history.

(56) References Cited

U.S. PATENT DOCUMENTS 5,018,054 A * 5/1991 Ohashi .................. F21V 9/00
                                                        313/112
5,446,825 A * 8/1995 Moslehi ............... C23C 16/481
                                                        118/724
(Continued)

FOREIGN PATENT DOCUMENTS

JP    2003-133245 A    5/2003
JP    2012-238779 A    12/2012
(Continued)

OTHER PUBLICATIONS

Taiwanese Office Action issued in corresponding Taiwanese Patent Application No. 106143863, dated Aug. 28, 2018, with English Translation of the Japanese Translation of the Taiwanese Office Action.

(Continued)

*Primary Examiner* — Joseph M. Pelham
(74) *Attorney, Agent, or Firm* — McDermott Will & Emery LLP

(57) ABSTRACT

A pyrometer holder is mounted to an outer wall of a chamber while holding a lower radiation thermometer. The front end of the lower radiation thermometer is brought into abutment with a mounting portion of the pyrometer holder, and a bottom plate is brought into abutment with the rear end of the lower radiation thermometer. A tension spring is tensioned between the bottom plate and the mounting portion to prevent the lower radiation thermometer from falling off or misregistration. An angle adjusting mechanism adjusts the angle of the radiation thermometer with respect to the outer wall of the chamber, with the front end of the radiation thermometer serving as a supporting point. Thus, the measurement position of the lower radiation thermometer is adjusted.

6 Claims, 13 Drawing Sheets

(51) Int. Cl.
*H01L 21/67* (2006.01)
*G01J 5/00* (2006.01)
*G01J 5/02* (2006.01)
*G01J 5/04* (2006.01)
*G01K 13/00* (2006.01)
*H01L 21/687* (2006.01)

(52) U.S. Cl.
CPC ............ *G01J 5/0275* (2013.01); *G01J 5/047* (2013.01); *H01L 21/67109* (2013.01); *H01L 21/67248* (2013.01); *H01L 21/6875* (2013.01); *H01L 21/68707* (2013.01); *H01L 21/68742* (2013.01); *H01L 21/68785* (2013.01)

(56) References Cited

U.S. PATENT DOCUMENTS

| | | | | |
|---|---|---|---|---|
| 5,715,361 | A * | 2/1998 | Moslehi | C23C 16/482 118/725 |
| 5,861,609 | A * | 1/1999 | Kaltenbrunner | H01L 21/2686 118/50.1 |
| 8,901,460 | B2 * | 12/2014 | Hashimoto | H01L 21/67115 219/411 |
| 9,082,728 | B2 * | 7/2015 | Yokouchi | H01L 21/324 |
| 9,351,341 | B2 * | 5/2016 | Nishide | H05B 1/00 |
| 9,607,868 | B2 * | 3/2017 | Okada | H01L 21/67103 |
| 9,920,993 | B2 * | 3/2018 | Hashimoto | F27B 17/0025 |
| 10,475,674 | B2 * | 11/2019 | Nishide | H01L 21/67115 |
| 2003/0146200 | A1 * | 8/2003 | Takahashi | C30B 31/12 219/390 |
| 2012/0288261 | A1 | 11/2012 | Hashimoto et al. | |
| 2012/0288970 | A1 | 11/2012 | Hashimoto et al. | |
| 2013/0078786 | A1 | 3/2013 | Fuse et al. | |
| 2014/0169772 | A1 * | 6/2014 | Abe | H01L 21/6875 392/418 |
| 2014/0206108 | A1 * | 7/2014 | Kiyama | H01L 21/67115 438/5 |
| 2017/0133247 | A1 | 5/2017 | Kiyama | |

FOREIGN PATENT DOCUMENTS

| | | |
|---|---|---|
| JP | 2012-238782 A | 12/2012 |
| KR | 10-2003-0033485 A | 5/2003 |
| KR | 10-2012-0045257 A | 5/2012 |
| KR | 10-2013-0033296 A | 4/2013 |
| TW | 201403037 A | 1/2014 |
| TW | 201431120 A | 8/2014 |
| WO | 2013/192510 A1 | 12/2013 |

OTHER PUBLICATIONS

Siddall and Hilton, "Tension Springs and their Applications", May 8, 2015, pp. 1-2.

Korean Notification of Reasons for Refusal issued in corresponding Korean Patent Application No. 10-2018-0015092, dated Aug. 7, 2019, with English translation.

Taiwanese Office Action issued in corresponding Taiwanese Patent Application No. 106143863, dated Dec. 28, 2018, with English Translation of the Japanese Translation of the Taiwanese Office Action.

Korean Decision to Grant a Patent issued in corresponding Korean Patent Application No. 10-2018-0015092, dated Jan. 2, 2020, with English translation.

* cited by examiner

F I G . 3
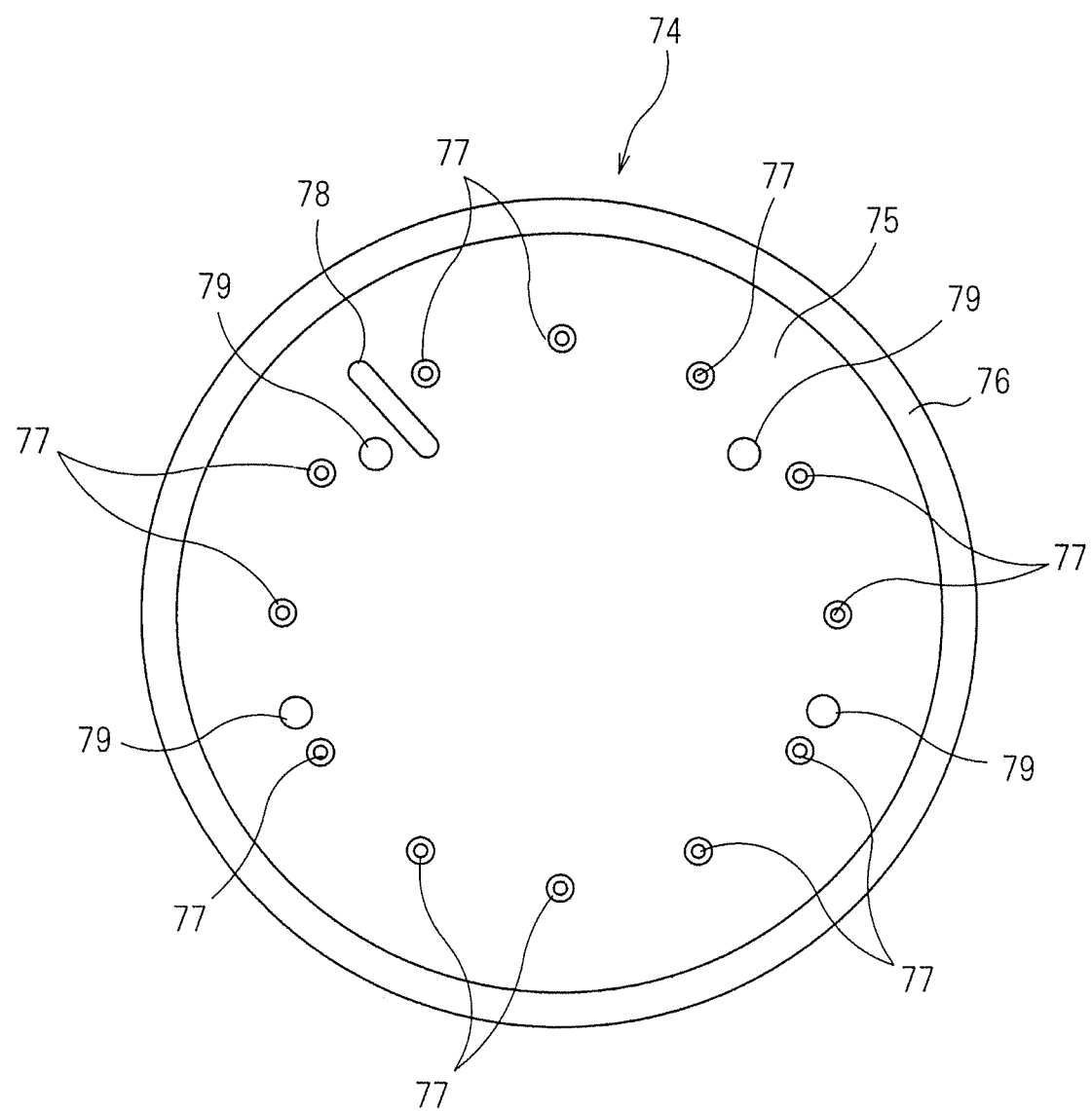

F I G . 1 1
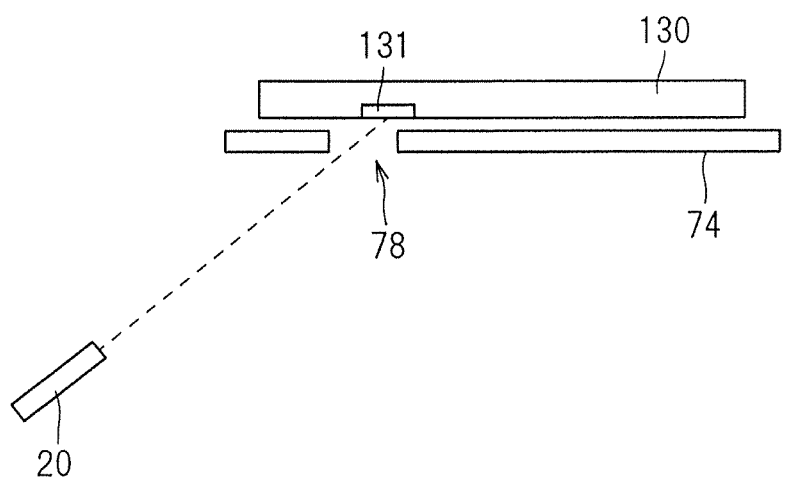

F I G . 1 2
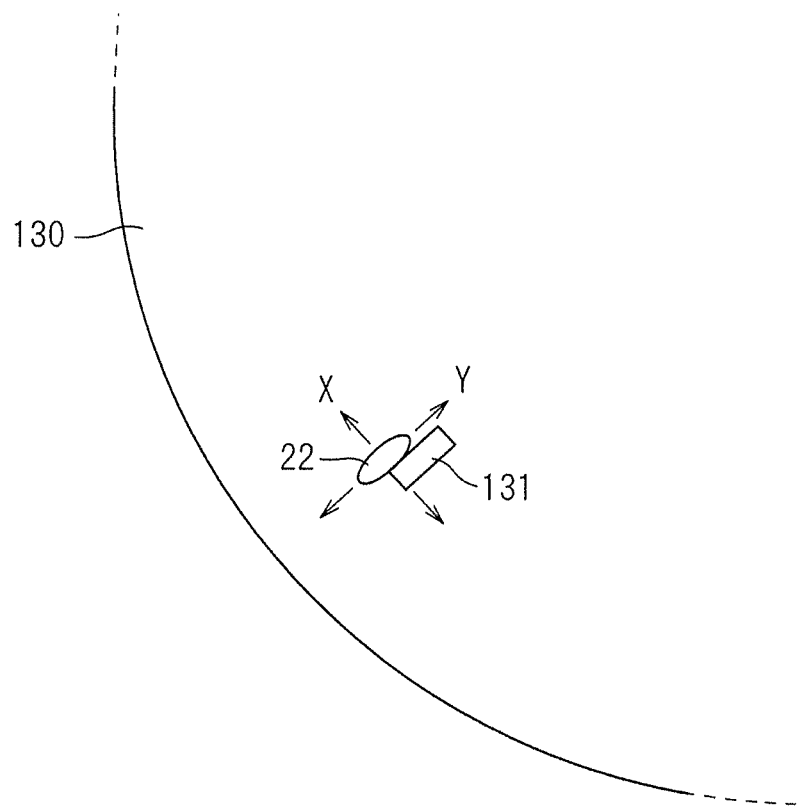

METHOD OF ADJUSTING MEASUREMENT POSITION OF RADIATION THERMOMETER AND HEAT TREATMENT APPARATUS

BACKGROUND OF THE INVENTION

Field of the Invention

The present invention relates to a heat treatment apparatus which irradiates a thin plate-like precision electronic substrate (hereinafter referred to simply as a "substrate") such as a semiconductor wafer with light to heat the substrate, and a method of adjusting the measurement position of a radiation thermometer for use in the heat treatment apparatus.

Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might constitute a hindrance to good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate a surface of a semiconductor wafer with a flash of light, thereby raising the temperature of only the surface of the semiconductor wafer implanted with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with a flash of light emitted from the xenon flash lamps, the temperature of the semiconductor wafer can be raised rapidly, with only a small amount of light transmitted through the semiconductor wafer. Also, it has turned out that flash irradiation, that is, the irradiation of a semiconductor wafer with a flash of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

Wafer temperature control is important not only in the flash lamp annealing but also in the heat treatment of a semiconductor wafer. Techniques in which radiation thermometers are provided obliquely above and below a semiconductor wafer to be treated and receive radiation emitted from main surfaces of the semiconductor wafer to measure the temperatures of the main surfaces are disclosed in U.S. Patent Application Publication No. 2012/0288970 and U.S. Patent Application Publication No. 2012/0288261.

Apparatuses for heat-treating a semiconductor wafer often effect feedback control of outputs from a heating source, based on information on the temperature of the semiconductor wafer measured with a radiation thermometer. The information on the temperature is the most important parameter. There has hence been a strong demand that the radiation thermometer precisely measures the temperature in a specified position lying within a semiconductor wafer surface.

In the conventional techniques, a radiation thermometer is merely mounted in a predetermined location of a heat treatment apparatus. Thus, whether the measurement position by means of the radiation thermometer is a specified position lying within a wafer surface or not is not assured, so that the temperature measurement is imprecise. Also, when the radiation thermometer is once removed for maintenance and the like and is then mounted again, the reproducibility of the measurement position of the radiation thermometer is unreliable. This causes temperature measurement conditions to differ from those before the removal.

SUMMARY OF THE INVENTION

The present invention is intended for a heat treatment apparatus for heating a substrate by irradiating the substrate with light.

According to one aspect of the present invention, the heat treatment apparatus comprises: a chamber for receiving a substrate therein; a light source for irradiating the substrate received in the chamber with light; a radiation thermometer of a cylindrical shape for receiving infrared radiation emitted from the substrate to measure the temperature of the substrate; a holder mounted to an outer wall of the chamber while holding the radiation thermometer; and a measurement position adjusting mechanism provided in the holder and for adjusting the measurement position of the radiation thermometer on the substrate.

The heat treatment apparatus is capable of precisely adjusting the measurement position of the radiation thermometer to a predetermined position lying within a substrate surface.

Preferably, the holder includes a tension spring for pressing the radiation thermometer against the holder from the rear end of the lower radiation thermometer toward the front end thereof.

This prevents the radiation thermometer from falling off or misregistration.

Preferably, the substrate in the chamber is held by a susceptor made of quartz and having an opening formed therein for allowing infrared radiation emitted from the lower surface of the substrate to pass therethrough, and the radiation thermometer is provided obliquely below the substrate to receive the infrared radiation having passed through the opening.

This reduces the influence of the thickness and type of a thin film formed on the substrate upon the emissivity of the substrate.

The present invention is also intended for a method of adjusting the measurement position of a radiation thermometer of a cylindrical shape for measuring the temperature of a substrate received in a chamber and subjected to heating by irradiation with light.

According to another aspect of the present invention, the method comprises the steps of: (a) mounting a holder holding the radiation thermometer to an outer wall of the chamber; and (b) adjusting the angle of the radiation thermometer, with the front end of the radiation thermometer serving as a supporting point, to thereby adjust the measurement position of the radiation thermometer on the substrate.

This method is capable of precisely adjusting the measurement position of the radiation thermometer to a predetermined position lying within a substrate surface.

Preferably, the substrate in the chamber is held by a susceptor made of quartz and having an opening formed therein for allowing infrared radiation emitted from the lower surface of the substrate to pass therethrough, and the radiation thermometer is provided obliquely below the substrate to receive the infrared radiation having passed through the opening.

This reduces the influence of the thickness and type of a thin film formed on the substrate upon the emissivity of the substrate.

It is therefore an object of the present invention to precisely adjust the measurement position of a radiation thermometer to a predetermined position lying within a substrate surface.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view of a susceptor;

FIG. 11 is a schematic view showing a heat source being held by the susceptor;

FIG. 12 is a view showing a measurement region of the lower radiation thermometer in a lower surface of a plate-like element.

DESCRIPTION OF THE PREFERRED EMBODIMENTS

A preferred embodiment according to the present invention will now be described in detail with reference to the drawings.

Figure 1:
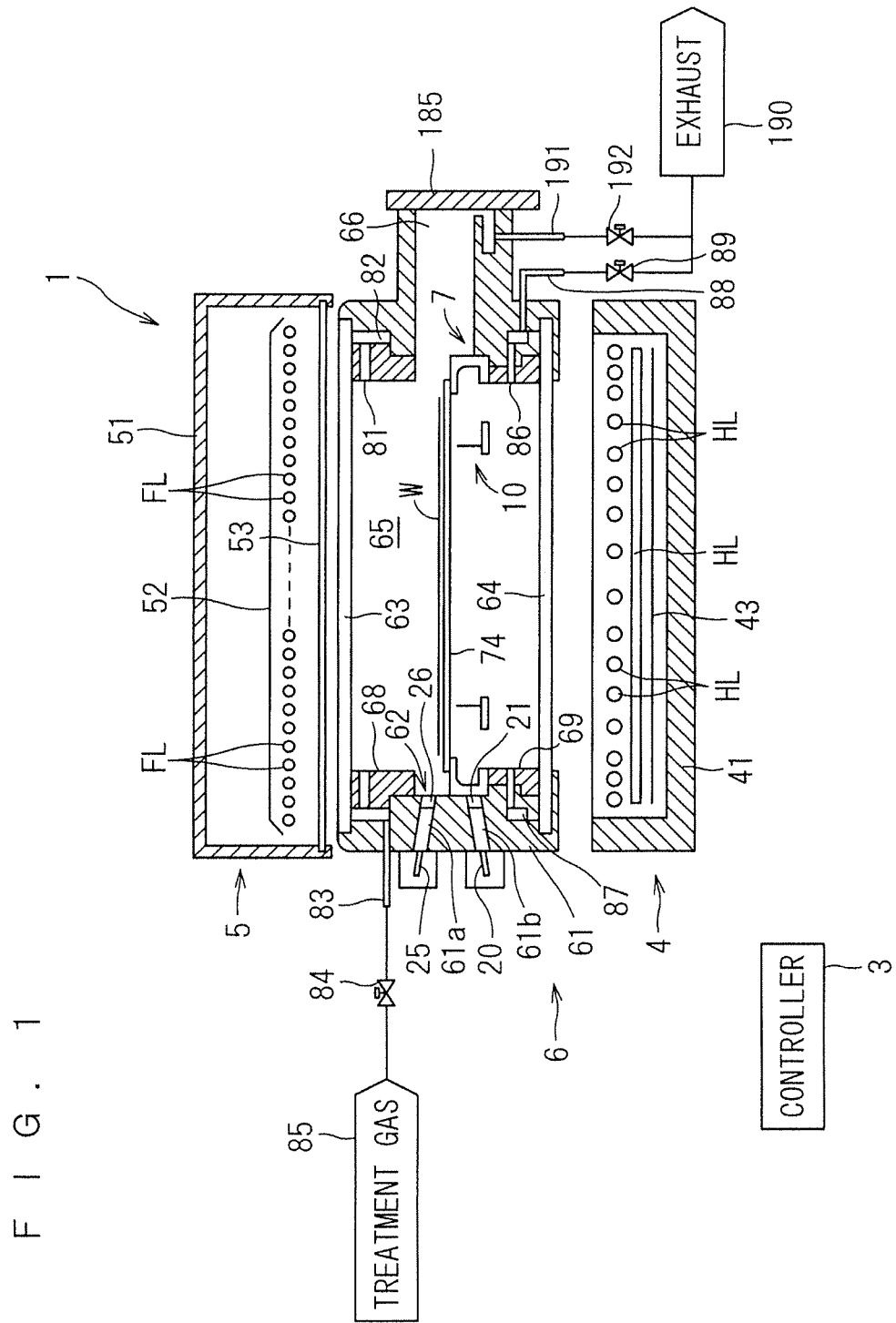
FIG. 1 is a longitudinal sectional view showing a configuration of a heat treatment apparatus according to the present invention.

FIG. 1 is a longitudinal sectional view showing a configuration of a heat treatment apparatus 1 according to the present invention. The heat treatment apparatus 1 of FIG. 1 is a flash lamp annealer for irradiating a disk-shaped semiconductor wafer W serving as a substrate with flashes of light to heat the semiconductor wafer W. The size of the semiconductor wafer W to be treated is not particularly limited. For example, the semiconductor wafer W to be treated has a diameter of 300 mm and 450 mm (in the present preferred embodiment, 300 mm). The semiconductor wafer W prior to the transport into the heat treatment apparatus 1 is implanted with impurities. The heat treatment apparatus 1 performs a heating treatment on the semiconductor wafer W to thereby activate the impurities implanted in the semiconductor wafer W. It should be noted that the dimensions of components and the number of components are shown in exaggeration or in simplified form, as appropriate, in FIG. 1 and the subsequent figures for the sake of easier understanding.

The heat treatment apparatus 1 includes a chamber 6 for receiving a semiconductor wafer W therein, a flash heating part 5 including a plurality of built-in flash lamps FL, and a halogen heating part 4 including a plurality of built-in halogen lamps HL. The flash heating part 5 is provided over the chamber 6, and the halogen heating part 4 is provided under the chamber 6. The heat treatment apparatus 1 further includes a holder 7 provided inside the chamber 6 and for holding a semiconductor wafer W in a horizontal attitude, and a transfer mechanism 10 provided inside the chamber 6 and for transferring a semiconductor wafer W between the holder 7 and the outside of the heat treatment apparatus 1. The heat treatment apparatus 1 further includes an upper radiation thermometer 25 and a lower radiation thermometer 20 both of which measure the temperature of a semiconductor wafer W subjected to heating. The heat treatment apparatus 1 further includes a controller 3 for controlling operating mechanisms provided in the halogen heating part 4, the flash heating part 5, and the chamber 6 to cause the operating mechanisms to heat-treat a semiconductor wafer W.

The chamber 6 is configured such that upper and lower chamber windows 63 and 64 made of quartz are mounted to the top and bottom, respectively, of a tubular chamber side portion 61. The chamber side portion 61 has a generally tubular shape having an open top and an open bottom. The upper chamber window 63 is mounted to block the top opening of the chamber side portion 61, and the lower chamber window 64 is mounted to block the bottom opening thereof. The upper chamber window 63 forming the ceiling of the chamber 6 is a disk-shaped member made of quartz, and serves as a quartz window that transmits flashes of light emitted from the flash heating part 5 therethrough into the chamber 6. The lower chamber window 64 forming the floor of the chamber 6 is also a disk-shaped member made of quartz, and serves as a quartz window that transmits light emitted from the halogen heating part 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws not shown. In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65.

A recessed portion 62 is defined in the inner wall surface of the chamber 6 by mounting the upper and lower reflective rings 68 and 69 to the chamber side portion 61. Specifically, the recessed portion 62 is defined which is surrounded by a middle portion of the inner wall surface of the chamber side portion 61 where the reflective rings 68 and 69 are not mounted, a lower end surface of the upper reflective ring 68, and an upper end surface of the lower reflective ring 69. The recessed portion 62 is provided in the form of a horizontal annular ring in the inner wall surface of the chamber 6, and surrounds the holder 7 which holds a semiconductor wafer W. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transport of a semiconductor wafer W therethrough into and out of the chamber 6. The transport opening 66 is openable and closable by a gate valve 185. The transport opening 66 is connected in communication with an outer peripheral surface of the recessed portion 62. Thus, when the transport opening 66 is opened by the gate valve 185, a semiconductor wafer W is allowed to be transported through the transport opening 66 and the recessed portion 62 into and out of the heat treatment space 65. When the transport opening 66 is closed by the gate valve 185, the heat treatment space 65 in the chamber 6 is an enclosed space.

The chamber side portion 61 is further provided with a through hole 61a and a through hole 61b both bored therein. The through hole 61a is a cylindrical hole for directing infrared radiation emitted from the upper surface of a semiconductor wafer W held by a susceptor 74 therethrough to the upper radiation thermometer 25. The through hole 61b is a cylindrical hole for directing infrared radiation emitted from the lower surface of the semiconductor wafer W held by the susceptor 74 therethrough to the lower radiation thermometer 20. The through hole 61a and the through hole 61b are inclined with respect to a horizontal direction so that the longitudinal axes (axes extending in respective directions in which the through holes 61a and 61b extend through the chamber side portion 61) of the through holes 61a and 61b intersect main surfaces of the semiconductor wafer W held by the susceptor 74. A transparent window 26 made of calcium fluoride material transparent to infrared radiation in a wavelength range measurable with the upper radiation thermometer 25 is mounted to an end portion of the through hole 61a which faces the heat treatment space 65. A transparent window 21 made of barium fluoride material transparent to infrared radiation in a wavelength range measurable with the lower radiation thermometer 20 is mounted to an end portion of the through hole 61b which faces the heat treatment space 65.

At least one gas supply opening 81 for supplying a treatment gas therethrough into the heat treatment space 65 is provided in an upper portion of the inner wall of the chamber 6. The gas supply opening 81 is provided above the recessed portion 62, and may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is inserted at some midpoint in the gas supply pipe 83. When the valve 84 is opened, the treatment gas is fed from the treatment gas supply source 85 to the buffer space 82. The treatment gas flowing in the buffer space 82 flows in a spreading manner within the buffer space 82 which is lower in fluid resistance than the gas supply opening 81, and is supplied through the gas supply opening 81 into the heat treatment space 65. Examples of the treatment gas usable herein include inert gases such as nitrogen gas ($N_2$), reactive gases such as hydrogen ($H_2$) and ammonia ($NH_3$), and mixtures of these gases (although nitrogen gas is used in this preferred embodiment).

At least one gas exhaust opening 86 for exhausting a gas from the heat treatment space 65 is provided in a lower portion of the inner wall of the chamber 6. The gas exhaust opening 86 is provided below the recessed portion 62, and may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust part 190. A valve 89 is inserted at some midpoint in the gas exhaust pipe 88. When the valve 89 is opened, the gas in the heat treatment space 65 is exhausted through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, arranged in a circumferential direction of the chamber 6, and may be in the form of slits. The treatment gas supply source 85 and the exhaust part 190 may be mechanisms provided in the heat treatment apparatus 1 or be utility systems in a factory in which the heat treatment apparatus 1 is installed.

A gas exhaust pipe 191 for exhausting the gas from the heat treatment space 65 is also connected to a distal end of the transport opening 66. The gas exhaust pipe 191 is connected through a valve 192 to the exhaust part 190. By opening the valve 192, the gas in the chamber 6 is exhausted through the transport opening 66.

Figure 2:
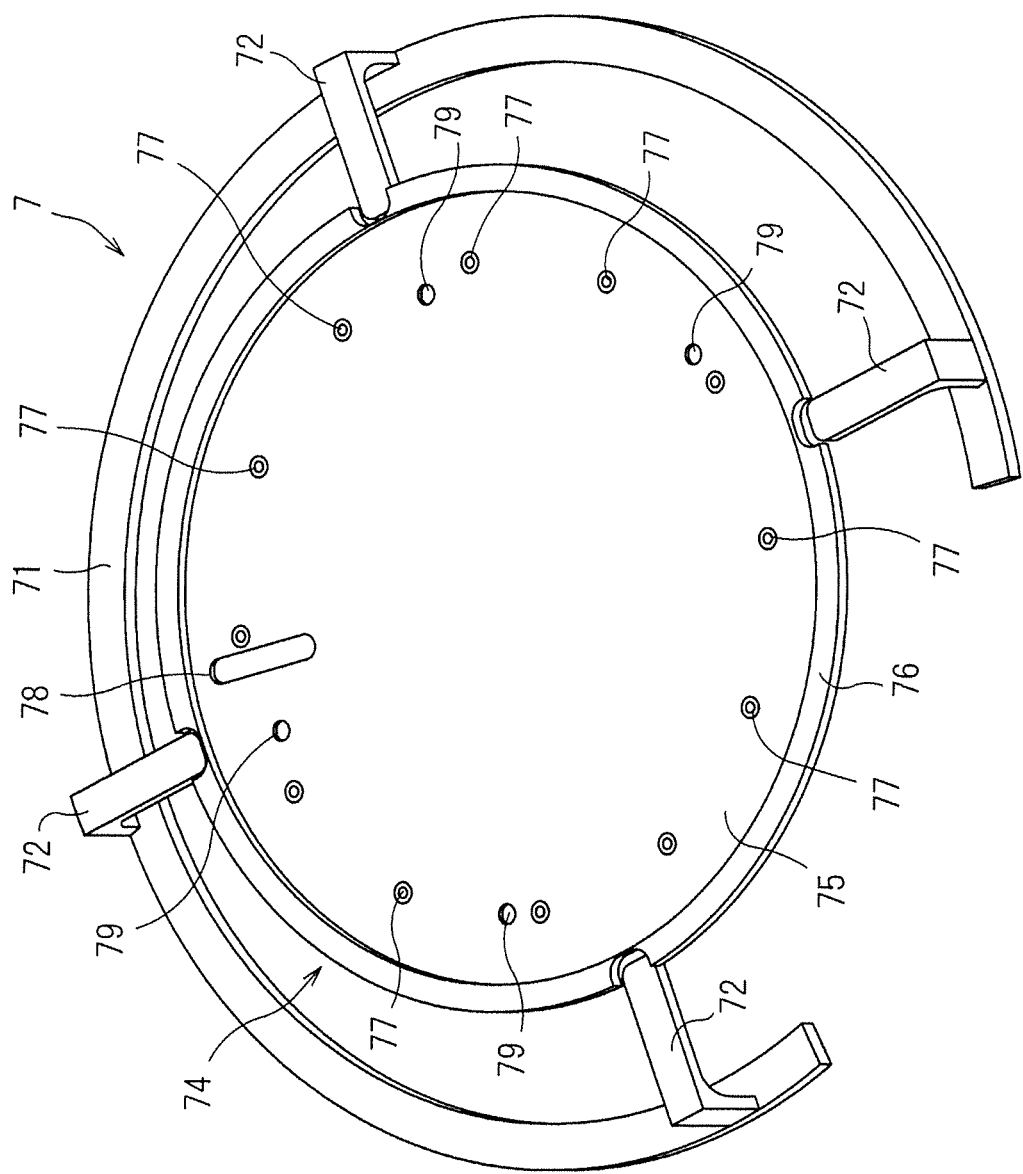
FIG. 2 is a perspective view showing the entire external appearance of a holder.

FIG. 2 is a perspective view showing the entire external appearance of the holder 7. The holder 7 includes a base ring 71, coupling portions 72, and the susceptor 74. The base ring 71, the coupling portions 72, and the susceptor 74 are all made of quartz. In other words, the whole of the holder 7 is made of quartz.

The base ring 71 is a quartz member having an arcuate shape obtained by removing a portion from an annular shape. This removed portion is provided to prevent interference between transfer arms 11 of the transfer mechanism 10 to be described later and the base ring 71. The base ring 71 is supported by a wall surface of the chamber 6 by being placed on the bottom surface of the recessed portion 62 (with reference to FIG. 1). The multiple coupling portions 72 (in the present preferred embodiment, four coupling portions 72) are mounted upright on the upper surface of the base ring 71 and arranged in a circumferential direction of the annular shape thereof. The coupling portions 72 are quartz members, and are rigidly secured to the base ring 71 by welding.

Figure 4:
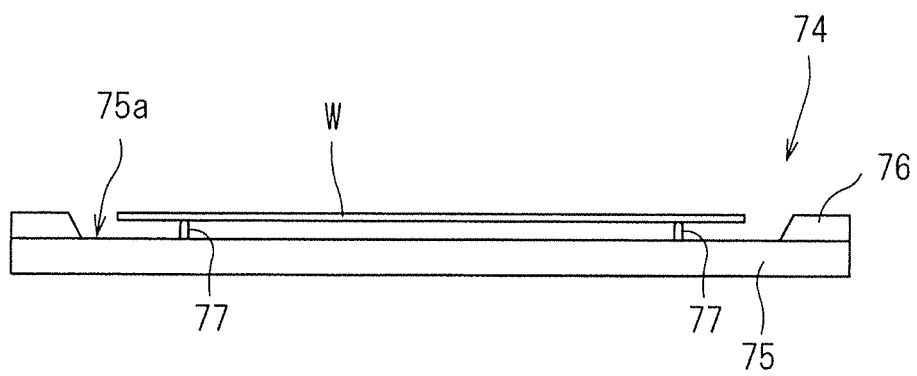
FIG. 4 is a sectional view of the susceptor.

The susceptor 74 is supported by the four coupling portions 72 provided on the base ring 71. FIG. 3 is a plan view of the susceptor 74. FIG. 4 is a sectional view of the susceptor 74. The susceptor 74 includes a holding plate 75, a guide ring 76, and a plurality of substrate support pins 77. The holding plate 75 is a generally circular planar member made of quartz. The diameter of the holding plate 75 is greater than that of a semiconductor wafer W. In other words, the holding plate 75 has a size, as seen in plan view, greater than that of the semiconductor wafer W.

The guide ring 76 is provided on a peripheral portion of the upper surface of the holding plate 75. The guide ring 76 is an annular member having an inner diameter greater than the diameter of the semiconductor wafer W. For example, when the diameter of the semiconductor wafer W is 300 mm, the inner diameter of the guide ring 76 is 320 mm. The inner periphery of the guide ring 76 is in the form of a tapered surface which becomes wider in an upward direction from the holding plate 75. The guide ring 76 is made of quartz similar to that of the holding plate 75. The guide ring 76 may be welded to the upper surface of the holding plate 75 or fixed to the holding plate 75 with separately machined pins and the like. Alternatively, the holding plate 75 and the guide ring 76 may be machined as an integral member.

A region of the upper surface of the holding plate 75 which is inside the guide ring 76 serves as a planar holding surface 75a for holding the semiconductor wafer W. The substrate support pins 77 are provided upright on the holding surface 75a of the holding plate 75. In the present preferred embodiment, a total of 12 substrate support pins 77 provided upright are spaced at intervals of 30 degrees along the circumference of a circle concentric with the outer circumference of the holding surface 75a (the inner circumference of the guide ring 76). The diameter of the circle on which the 12 substrate support pins 77 are disposed (the distance between opposed ones of the substrate support pins 77) is slightly smaller than the diameter of the semiconductor wafer W, and is 270 to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

Referring again to FIG. 2, the four coupling portions 72 provided upright on the base ring 71 and the peripheral portion of the holding plate 75 of the susceptor 74 are rigidly secured to each other by welding. In other words, the susceptor 74 and the base ring 71 are fixedly coupled to each other with the coupling portions 72. The base ring 71 of such a holder 7 is supported by the wall surface of the chamber 6, whereby the holder 7 is mounted to the chamber 6. With the holder 7 mounted to the chamber 6, the holding plate 75 of the susceptor 74 assumes a horizontal attitude (an attitude such that the normal to the susceptor 74 coincides with a vertical direction). In other words, the holding surface 75a of the holding plate 75 becomes a horizontal surface.

A semiconductor wafer W transported into the chamber 6 is placed and held in a horizontal attitude on the susceptor 74 of the holder 7 mounted to the chamber 6. At this time, the semiconductor wafer W is supported by the 12 substrate support pins 77 provided upright on the holding plate 75, and is held by the susceptor 74. More strictly speaking, the 12 substrate support pins 77 have respective upper end portions coming in contact with the lower surface of the semiconductor wafer W to support the semiconductor wafer W. The semiconductor wafer W is supported in a horizontal attitude by the 12 substrate support pins 77 because the 12 substrate support pins 77 have a uniform height (distance from the upper ends of the substrate support pins 77 to the holding surface 75a of the holding plate 75).

The semiconductor wafer W supported by the substrate support pins 77 is spaced a predetermined distance apart from the holding surface 75a of the holding plate 75. The thickness of the guide ring 76 is greater than the height of the substrate support pins 77. Thus, the guide ring 76 prevents the horizontal misregistration of the semiconductor wafer W supported by the substrate support pins 77.

As shown in FIGS. 2 and 3, an opening 78 is formed in the holding plate 75 of the susceptor 74 so as to extend vertically through the holding plate 75 of the susceptor 74. The opening 78 is formed in a position where the longitudinal axis of the through hole 61b bored in the chamber side portion 61 and the holding plate 75 of the susceptor 74 intersect each other. The opening 78 is provided for the lower radiation thermometer 20 to receive radiation (infrared radiation) emitted from the lower surface of the semiconductor wafer W. Specifically, the lower radiation thermometer 20 receives the radiation emitted from the lower surface of the semiconductor wafer W through the opening 78 and the transparent window 21 mounted to the through hole 61b in the chamber side portion 61 to measure the temperature of the semiconductor wafer W. To this end, it is necessary that the measurement position of the lower radiation thermometer 20 on the lower surface of the semiconductor wafer W is adjusted to within the range of the visual field obtained when the lower surface of the semiconductor wafer W is viewed from the lower radiation thermometer 20 through the opening 78. A technique for the adjustment will be described in detail later. Further, the holding plate 75 of the susceptor 74 further includes four through holes 79 bored therein and designed so that lift pins 12 of the transfer mechanism 10 to be described later pass through the through holes 79, respectively, to transfer a semiconductor wafer W.

Figure 5:
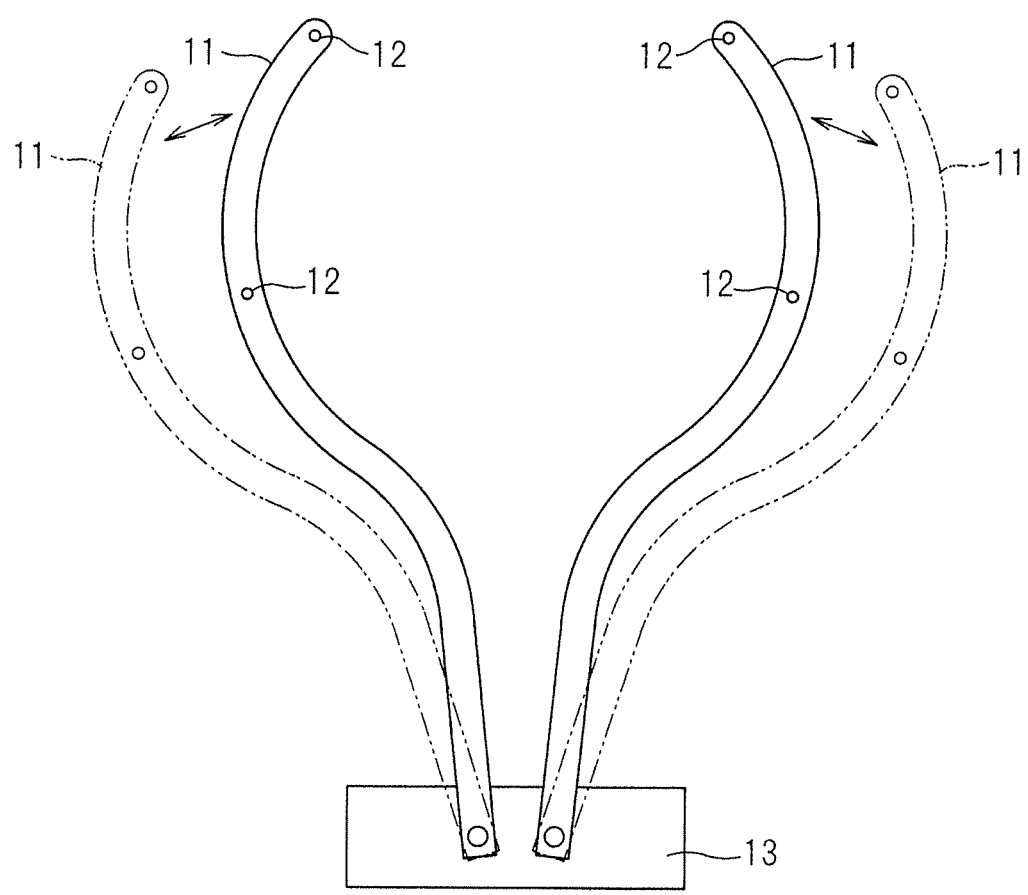
FIG. 5 is a plan view of a transfer mechanism.
Figure 6:
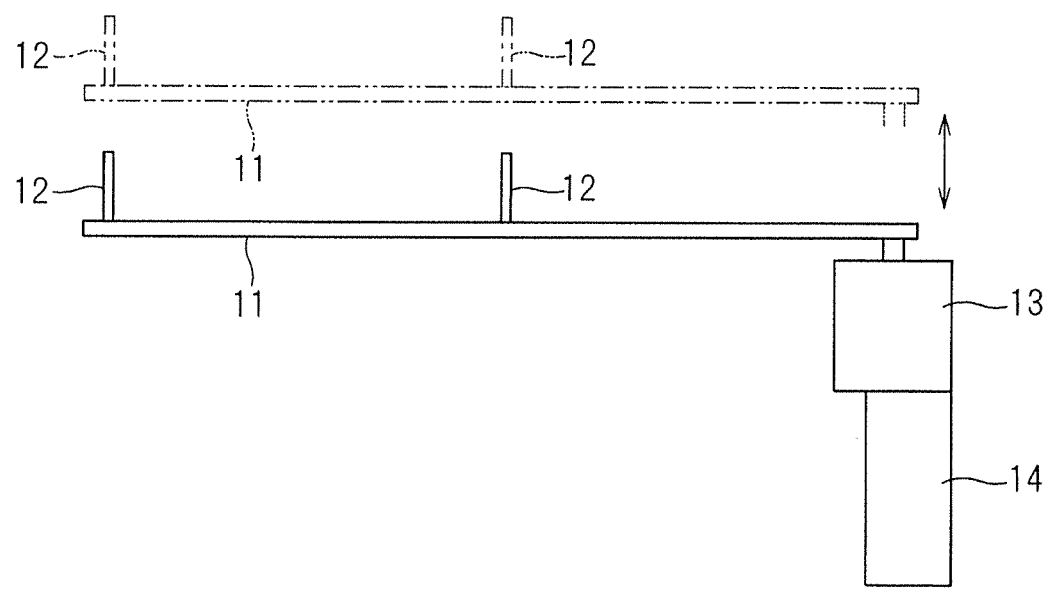
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 are of an arcuate configuration extending substantially along the annular recessed portion 62. Each of the transfer arms 11 includes the two lift pins 12 mounted upright thereon. The transfer arms 11 and the lift pins 12 are made of quartz. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type which causes individual motors to pivot the transfer arms 11 respectively or of the type which uses a linkage mechanism to cause a single motor to pivot the pair of transfer arms 11 in cooperative relation.

The transfer arms 11 are moved upwardly and downwardly together with the horizontal movement mechanism 13 by an elevating mechanism 14. As the elevating mechanism 14 moves up the pair of transfer arms 11 in their transfer operation position, the four lift pins 12 in total pass through the respective four through holes 79 (with reference to FIGS. 2 and 3) bored in the susceptor 74 so that the upper ends of the lift pins 12 protrude from the upper surface of the susceptor 74. On the other hand, as the elevating mechanism 14 moves down the pair of transfer arms 11 in their transfer operation position to take the lift pins 12 out of the respective through holes 79 and the horizontal movement mechanism 13 moves the pair of transfer arms 11 so as to open the transfer arms 11, the transfer arms 11 move to their retracted position. The retracted position of the pair of transfer arms 11 is immediately over the base ring 71 of the holder 7. The retracted position of the transfer arms 11 is inside the recessed portion 62 because the base ring 71 is placed on the bottom surface of the recessed portion 62. An exhaust mechanism not shown is also provided near the location where the drivers (the horizontal movement mechanism 13 and the elevating mechanism 14) of the transfer mechanism 10 are provided, and is configured to exhaust an atmosphere around the drivers of the transfer mechanism 10 to the outside of the chamber 6.

Referring again to FIG. 1, the flash heating part 5 provided over the chamber 6 includes an enclosure 51, a light source provided inside the enclosure 51 and including the multiple (in the present preferred embodiment, 30) xenon flash lamps FL, and a reflector 52 provided inside the enclosure 51 so as to cover the light source from above. The flash heating part 5 further includes a lamp light radiation window 53 mounted to the bottom of the enclosure 51. The lamp light radiation window 53 forming the floor of the flash heating part 5 is a plate-like quartz window made of quartz. The flash heating part 5 is provided over the chamber 6, whereby the lamp light radiation window 53 is opposed to the upper chamber window 63. The flash lamps FL direct flashes of light from over the chamber 6 through the lamp light radiation window 53 and the upper chamber window 63 toward the heat treatment space 65.

The flash lamps FL, each of which is a rod-shaped lamp having an elongated cylindrical shape, are arranged in a plane so that the longitudinal directions of the respective flash lamps FL are in parallel with each other along a main surface of a semiconductor wafer W held by the holder 7 (that is, in a horizontal direction). Thus, a plane defined by the arrangement of the flash lamps FL is also a horizontal plane.

Each of the xenon flash lamps FL includes a rod-shaped glass tube (discharge tube) containing xenon gas sealed therein and having positive and negative electrodes provided on opposite ends thereof and connected to a capacitor, and a trigger electrode attached to the outer peripheral surface of the glass tube. Because the xenon gas is electrically insulative, no current flows in the glass tube in a normal state even if electrical charge is stored in the capacitor. However, if a high voltage is applied to the trigger electrode to produce an electrical breakdown, electricity stored in the capacitor flows momentarily in the glass tube, and xenon atoms or molecules are excited at this time to cause light emission. Such a xenon flash lamp FL has the property of being capable of emitting extremely intense light as compared with a light source that stays lit continuously such as a halogen lamp HL because the electrostatic energy previously stored in the capacitor is converted into an ultrashort light pulse ranging from 0.1 to 100 milliseconds. Thus, the flash lamps FL are pulsed light emitting lamps which emit light instantaneously for an extremely short time period of less than one second. The light emission time of the flash lamps FL is adjustable by the coil constant of a lamp light source which supplies power to the flash lamps FL.

The reflector 52 is provided over the plurality of flash lamps FL so as to cover all of the flash lamps FL. A fundamental function of the reflector 52 is to reflect flashes of light emitted from the plurality of flash lamps FL toward the heat treatment space 65. The reflector 52 is a plate made of an aluminum alloy. A surface of the reflector 52 (a surface which faces the flash lamps FL) is roughened by abrasive blasting.

The halogen heating part 4 provided under the chamber 6 includes an enclosure 41 incorporating a light source including the multiple (in the present preferred embodiment, 40) halogen lamps HL. The halogen heating part 4 is a light irradiator that directs light from under the chamber 6 through the lower chamber window 64 toward the heat treatment space 65 to heat the semiconductor wafer W by means of the halogen lamps HL.

Figure 7:
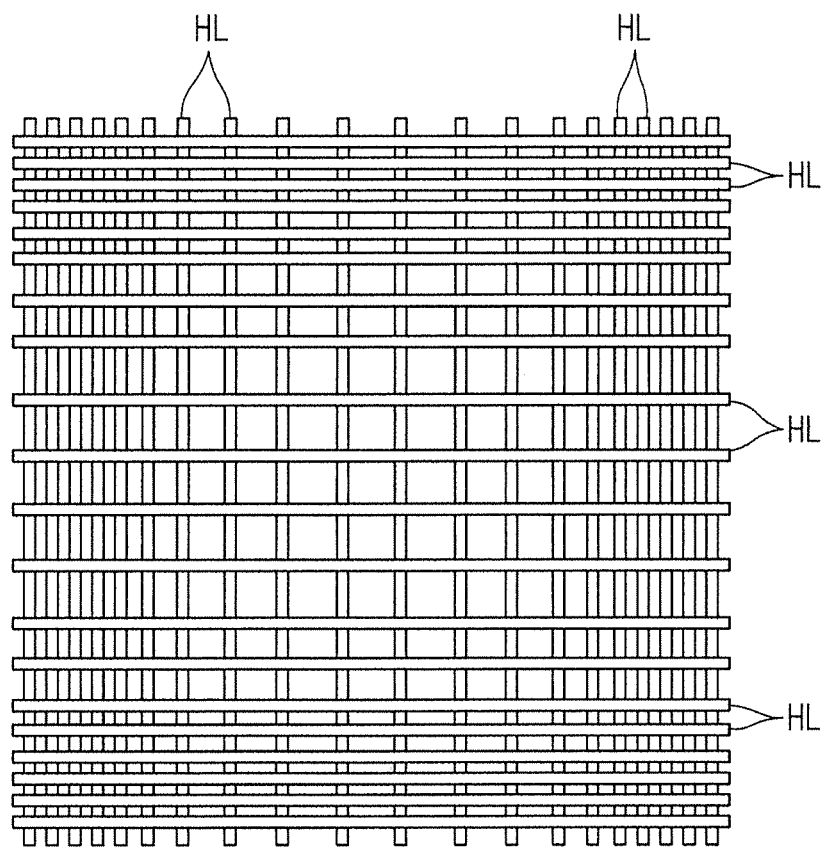
FIG. 7 is a plan view showing an arrangement of halogen lamps.

FIG. 7 is a plan view showing an arrangement of the multiple halogen lamps HL. The 40 halogen lamps HL are arranged in two tiers, i.e. upper and lower tiers. That is, 20 halogen lamps HL are arranged in the upper tier closer to the holder 7, and 20 halogen lamps HL are arranged in the lower tier farther from the holder 7 than the upper tier. Each of the halogen lamps HL is a rod-shaped lamp having an elongated cylindrical shape. The 20 halogen lamps HL in each of the upper and lower tiers are arranged so that the longitudinal directions thereof are in parallel with each other along a main surface of a semiconductor wafer W held by the holder 7 (that is, in a horizontal direction). Thus, a plane defined by the arrangement of the halogen lamps HL in each of the upper and lower tiers is also a horizontal plane.

As shown in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating part 4.

The group of halogen lamps HL in the upper tier and the group of halogen lamps HL in the lower tier are arranged to intersect each other in a lattice pattern. In other words, the 40 halogen lamps HL in total are disposed so that the longitudinal direction of the 20 halogen lamps HL arranged in the upper tier and the longitudinal direction of the 20 halogen lamps HL arranged in the lower tier are orthogonal to each other.

Each of the halogen lamps HL is a filament-type light source which passes current through a filament disposed in a glass tube to make the filament incandescent, thereby emitting light. A gas prepared by introducing a halogen element (iodine, bromine and the like) in trace amounts into an inert gas such as nitrogen, argon and the like is sealed in the glass tube. The introduction of the halogen element allows the temperature of the filament to be set at a high temperature while suppressing a break in the filament. Thus, the halogen lamps HL have the properties of having a longer life than typical incandescent lamps and being capable of continuously emitting intense light. Thus, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the enclosure 41 of the halogen heating part 4 under the halogen lamps HL arranged in two tiers (FIG. 1). The reflector 43 reflects the light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data and the like therein. The CPU in the controller 3 executes a predetermined processing program, whereby the processes in the heat treatment apparatus 1 proceed.

As shown in FIG. 1, the heat treatment apparatus 1 includes the upper radiation thermometer 25 and the lower radiation thermometer 20. The upper radiation thermometer 25 provided obliquely above the semiconductor wafer W held by the susceptor 74 is a high-speed radiation thermometer for measuring abrupt changes in the temperature of the upper surface of the semiconductor wafer W at the instant of irradiation with flashes of light from the flash lamps FL. The lower radiation thermometer 20 provided obliquely below the semiconductor wafer W held by the susceptor 74 measures the temperature of the lower surface of the semiconductor wafer W. The output from the halogen lamps HL is controlled based on the result of measurement with the lower radiation thermometer 20.

Figure 8:
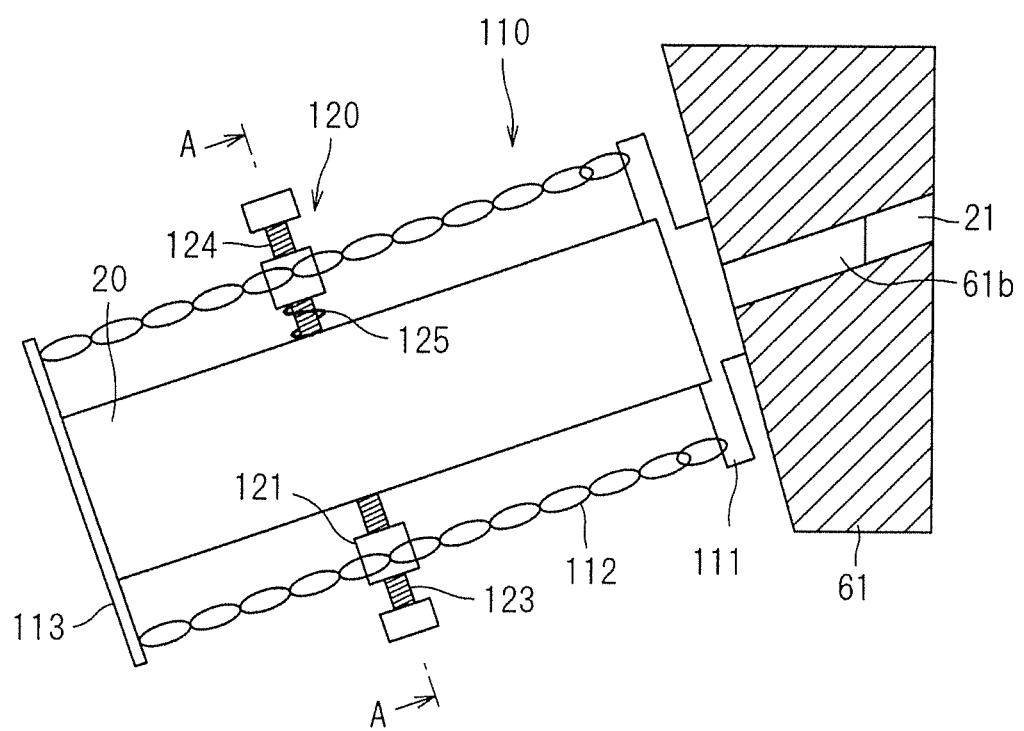
FIG. 8 is a side view for illustrating the mounting of a lower radiation thermometer to a chamber side portion.
Figure 9:
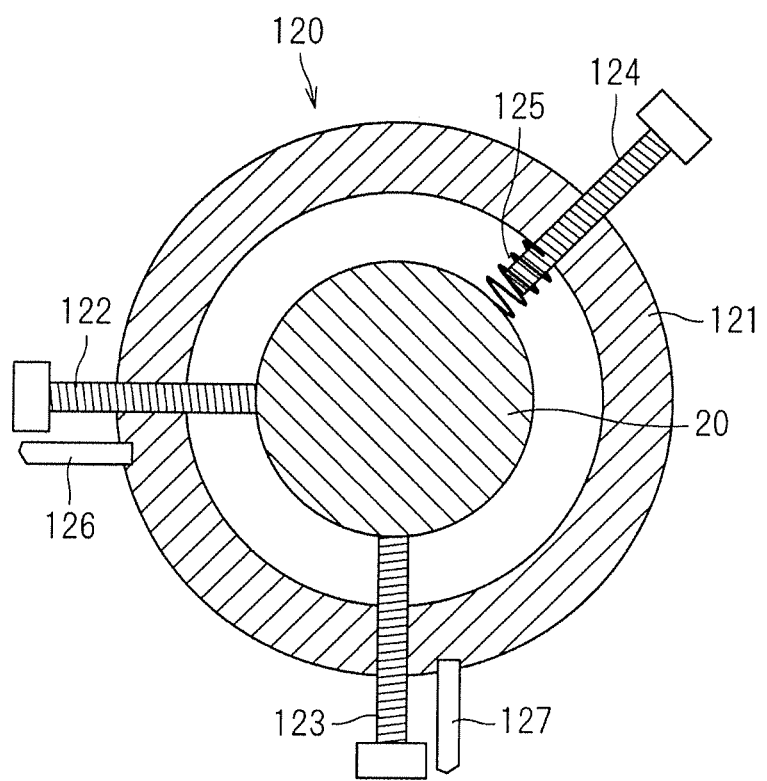
FIG. 9 is a sectional view taken along the line A-A of FIG. 8.

FIG. 8 is a side view for illustrating the mounting of the lower radiation thermometer 20 to the chamber side portion 61. FIG. 9 is a sectional view taken along the line A-A of FIG. 8. In the present preferred embodiment, the lower radiation thermometer 20 is mounted to the chamber 6 while being held by a pyrometer holder 110.

The lower radiation thermometer 20 includes an enclosure of a cylindrical shape, and a light receiving element incorporated in the enclosure and for receiving infrared radiation. The cylindrical lower radiation thermometer 20 is mounted to an outer wall surface of the chamber side portion 61 of the chamber 6 by means of the pyrometer holder 110 so that the optical axis thereof approximately coincides with the longitudinal axis of the through hole 61b. The lower radiation thermometer 20 receives infrared radiation emitted from the lower surface of the semiconductor wafer W held by the susceptor 74 through the opening 78 and passing through the transparent window 21 made of barium fluoride. The transparent window 21 made of barium fluoride allows infrared radiation in a wavelength range measurable with the lower radiation thermometer 20 to selectively pass therethrough. A separately placed detector calculates the temperature of the lower surface of the semiconductor wafer W, based on a signal outputted from the lower radiation thermometer 20 in response to the receipt of the infrared radiation emitted from the lower surface of the semiconductor wafer W.

The pyrometer holder 110 includes a mounting portion 111, a tension spring 112, a bottom plate 113, and an angle adjusting mechanism 120. The mounting portion 111 is mounted to the outer wall of the chamber side portion 61 of the chamber 6 by fastening with screws not shown. The front end of the lower radiation thermometer 20 is brought into abutment with the mounting portion 111, and the bottom plate 113 is brought into abutment with the rear end of the lower radiation thermometer 20. In this state, the tension spring 112 is tensioned between the bottom plate 113 and the mounting portion 111. That is, the tension spring 112 is tensioned between the bottom plate 113 and the mounting portion 111 while the lower radiation thermometer 20 is held between the bottom plate 113 and the mounting portion 111. Thus, the lower radiation thermometer 20 is pressed by the pyrometer holder 110 from the rear end of the lower radiation thermometer 20 toward the front end thereof. This prevents the lower radiation thermometer 20 in use from falling off or misregistration. This also prevents the front end of the lower radiation thermometer 20 serving as a supporting point from slippage or misregistration with respect to the pyrometer holder 110 during the adjustment of the measurement position of the lower radiation thermometer 20 which will be described later.

The angle adjusting mechanism 120 provided in the pyrometer holder 110 includes an adjusting ring 121, a first knurled bolt 122, a second knurled bolt 123, and a spring-equipped bolt 124. The angle adjusting mechanism 120 is a mechanism which adjusts the angle of the lower radiation thermometer 20 with respect to the outer wall of the chamber 6, with the front end of the lower radiation thermometer 20 in abutment with the mounting portion 111 serving as the supporting point, to thereby adjust the measurement position of the lower radiation thermometer 20. The adjusting ring 121 is an annular member. The adjusting ring 121 has an inner diameter greater than the diameter of the cylindrical lower radiation thermometer 20. The adjusting ring 121 is provided so as to surround the cylindrical side wall surface of the lower radiation thermometer 20. A fixed distance is defined between the inner side surface of the adjusting ring 121 and the side wall surface of the lower radiation thermometer 20. The adjusting ring 121 is provided so as to surround part of the side wall surface which is closer to the rear end of the lower radiation thermometer 20 with respect to the longitudinal midpoint of the cylindrical lower radiation thermometer 20.

The first knurled bolt 122 is brought in threaded engagement with the adjusting ring 121 so that the longitudinal direction of the first knurled bolt 122 extends in a horizontal direction. The front end of the first knurled bolt 122 abuts against the cylindrical side wall surface of the lower radiation thermometer 20 in a horizontal direction. The second knurled bolt 123 is brought in threaded engagement with the adjusting ring 121 so that the longitudinal direction of the second knurled bolt 123 extends in a vertical direction. The front end of the second knurled bolt 123 abuts against the cylindrical side wall surface of the lower radiation thermometer 20 from below in a vertical direction. That is, the longitudinal direction of the first knurled bolt 122 and the longitudinal direction of the second knurled bolt 123 form a right angle.

The spring-equipped bolt 124 is brought in threaded engagement with the adjusting ring 121 so that the longitudinal direction of the spring-equipped bolt 124 forms an angle of 135 degrees with the longitudinal direction of the first knurled bolt 122 and with the longitudinal direction of the second knurled bolt 123. A spring 125 is provided so as to surround a front end portion of the spring-equipped bolt 124. The spring 125 is provided between the inner side surface of the adjusting ring 121 and the side wall surface of the lower radiation thermometer 20, and presses the side wall surface of the lower radiation thermometer 20 toward the central axis of the lower radiation thermometer 20.

The adjusting ring 121 is provided with a first gauge 126 and a second gauge 127. The first gauge 126 is provided for measuring the amount of rotation of the first knurled bolt 122 with respect to the adjusting ring 121. The second gauge 127 is provided for measuring the amount of rotation of the second knurled bolt 123 with respect to the adjusting ring 121. The upper radiation thermometer 25 may be mounted to the chamber 6 with the use of the same configuration as the lower radiation thermometer 20.

The heat treatment apparatus 1 further includes, in addition to the aforementioned components, various cooling structures to prevent an excessive temperature rise in the halogen heating part 4, the flash heating part 5 and the chamber 6 because of the heat energy generated from the halogen lamps HL and the flash lamps FL during the heat treatment of a semiconductor wafer W. As an example, a water cooling tube (not shown) is provided in the walls of the chamber 6. Also, the halogen heating part 4 and the flash heating part 5 have an air cooling structure for forming a gas flow therein to exhaust heat. Air is supplied to a gap between the upper chamber window 63 and the lamp light radiation window 53 to cool down the flash heating part 5 and the upper chamber window 63.

Next, a procedure for the treatment of a semiconductor wafer W in the heat treatment apparatus 1 will be described. A semiconductor wafer W to be treated herein is a semiconductor substrate doped with impurities (ions) by an ion implantation process. The impurities are activated by the heat treatment apparatus 1 performing the process of heating (annealing) the semiconductor wafer W by irradiation with a flash of light. The procedure for the treatment in the heat treatment apparatus 1 which will be described below proceeds under the control of the controller 3 over the operating mechanisms of the heat treatment apparatus 1.

First, the valve 84 is opened for supply of gas, and the valves 89 and 192 for exhaust of gas are opened, so that the supply and exhaust of gas into and out of the chamber 6 start. When the valve 84 is opened, nitrogen gas is supplied through the gas supply opening 81 into the heat treatment space 65. When the valve 89 is opened, the gas within the chamber 6 is exhausted through the gas exhaust opening 86. This causes the nitrogen gas supplied from an upper portion of the heat treatment space 65 in the chamber 6 to flow downwardly and then to be exhausted from a lower portion of the heat treatment space 65.

The gas within the chamber 6 is exhausted also through the transport opening 66 by opening the valve 192. Further, the exhaust mechanism not shown exhausts an atmosphere near the drivers of the transfer mechanism 10. It should be noted that the nitrogen gas is continuously supplied into the heat treatment space 65 during the heat treatment of a semiconductor wafer W in the heat treatment apparatus 1. The amount of nitrogen gas supplied into the heat treatment space 65 is changed as appropriate in accordance with process steps.

Subsequently, the gate valve 185 is opened to open the transport opening 66. A transport robot outside the heat treatment apparatus 1 transports a semiconductor wafer W to be treated through the transport opening 66 into the heat treatment space 65 of the chamber 6. At this time, there is a danger that an atmosphere outside the heat treatment apparatus 1 is carried into the heat treatment space 65 as the semiconductor wafer W is transported into the heat treatment space 65. However, the nitrogen gas flows outwardly through the transport opening 66 to minimize the outside atmosphere carried into the heat treatment space 65.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upwardly, whereby the lift pins 12 pass through the through holes 79 and protrude from the upper surface of the holding plate 75 of the susceptor 74 to receive the semiconductor wafer W. At this time, the lift pins 12 move upwardly to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downwardly to transfer the semiconductor wafer W from the transfer mechanism 10 to the susceptor 74 of the holder 7, so that the semiconductor wafer W is held in a horizontal attitude from below. The semiconductor wafer W is supported by the substrate support pins 77 provided upright on the holding plate 75, and is held by the susceptor 74. The semiconductor wafer W is held by the holder 7 in such an attitude that the front surface thereof patterned and implanted with impurities is the upper surface. A predetermined distance is defined between the back surface (a main surface opposite from the front surface) of the semiconductor wafer W supported by the substrate support pins 77 and the holding surface 75a of the holding plate 75. The pair of transfer arms 11 moved downwardly below the susceptor 74 is moved back to the retracted position, i.e. to the inside of the recessed portion 62, by the horizontal movement mechanism 13.

After the semiconductor wafer W is held in a horizontal attitude from below by the susceptor 74 of the holder 7 made of quartz, the 40 halogen lamps HL in the halogen heating part 4 turn on simultaneously to start preheating (or assist-heating). Halogen light emitted from the halogen lamps HL is transmitted through the lower chamber window 64 and the susceptor 74 both made of quartz, and impinges upon the lower surface of the semiconductor wafer W. By receiving halogen light irradiation from the halogen lamps HL, the semiconductor wafer W is preheated, so that the temperature of the semiconductor wafer W increases. It should be noted that the transfer arms 11 of the transfer mechanism 10, which are retracted to the inside of the recessed portion 62, do not become an obstacle to the heating using the halogen lamps HL.

The temperature of the semiconductor wafer W is measured with the lower radiation thermometer 20 when the halogen lamps HL perform the preheating. Specifically, the lower radiation thermometer 20 receives infrared radiation emitted from the lower surface of the semiconductor wafer W held by the susceptor 74 through the opening 78 and passing through the transparent window 21 to measure the temperature of the semiconductor wafer W which is on the increase. The measured temperature of the semiconductor wafer W is transmitted to the controller 3. The controller 3 controls the output from the halogen lamps HL while monitoring whether the temperature of the semiconductor wafer W which is on the increase by the irradiation with light from the halogen lamps HL reaches a predetermined preheating temperature T1 or not. In other words, the controller 3 effects feedback control of the output from the halogen lamps HL so that the temperature of the semiconductor wafer W is equal to the preheating temperature T1, based on the value measured with the lower radiation thermometer 20. In this manner, the lower radiation thermometer 20 is a radiation thermometer for controlling the temperature of the semiconductor wafer W during the preheating. The preheating temperature T1 shall be on the order of 200° to 800° C., preferably on the order of 350° to 600° C., (in the present preferred embodiment, 600° C.) at which there is no apprehension that the impurities implanted in the semiconductor wafer W are diffused by heat.

After the temperature of the semiconductor wafer W reaches the preheating temperature T1, the controller 3 maintains the temperature of the semiconductor wafer W at the preheating temperature T1 for a short time. Specifically, at the point in time when the temperature of the semiconductor wafer W measured with the lower radiation thermometer 20 reaches the preheating temperature T1, the controller 3 adjusts the output from the halogen lamps HL to maintain the temperature of the semiconductor wafer W at approximately the preheating temperature T1.

By performing such preheating using the halogen lamps HL, the temperature of the entire semiconductor wafer W is uniformly increased to the preheating temperature T1. In the stage of preheating using the halogen lamps HL, the semiconductor wafer W shows a tendency to be lower in temperature in a peripheral portion thereof where heat dissipation is liable to occur than in a central portion thereof. However, the halogen lamps HL in the halogen heating part 4 are disposed at a higher density in the region opposed to the peripheral portion of the semiconductor wafer W than in the region opposed to the central portion thereof. This causes a greater amount of light to impinge upon the peripheral portion of the semiconductor wafer W where heat dissipation is liable to occur, thereby providing a uniform in-plane temperature distribution of the semiconductor wafer W in the stage of preheating.

The flash lamps FL in the flash heating part 5 irradiate the front surface of the semiconductor wafer W held by the susceptor 74 with a flash of light at the time when a predetermined time period has elapsed since the temperature of the semiconductor wafer W reached the preheating temperature T1. At this time, part of the flash of light emitted from the flash lamps FL travels directly toward the interior of the chamber 6. The remainder of the flash of light is reflected once from the reflector 52, and then travels toward the interior of the chamber 6. The irradiation of the semiconductor wafer W with such flashes of light achieves the flash heating of the semiconductor wafer W.

The flash heating, which is achieved by the emission of a flash of light from the flash lamps FL, is capable of increasing the temperature of the front surface of the semiconductor wafer W in a short time. Specifically, the flash of light emitted from the flash lamps FL is an intense flash of light emitted for an extremely short period of time ranging from about 0.1 to about 100 milliseconds as a result of the conversion of the electrostatic energy previously stored in the capacitor into such an ultrashort light pulse. The temperature of the front surface of the semiconductor wafer W subjected to the flash heating by the flash irradiation from the flash lamps FL momentarily increases to a treatment temperature T2 of 1000° C. or higher. After the impurities implanted in the semiconductor wafer W are activated, the temperature of the front surface of the semiconductor wafer W decreases rapidly. Because of the capability of increasing and decreasing the temperature of the front surface of the semiconductor wafer W in an extremely short time, the heat treatment apparatus 1 achieves the activation of the impurities implanted in the semiconductor wafer W while suppressing the diffusion of the impurities due to heat. It should be noted that the time required for the activation of the impurities is extremely short as compared with the time required for the thermal diffusion of the impurities. Thus, the activation is completed in a short time ranging from about 0.1 to about 100 milliseconds during which no diffusion occurs. Also, the temperature of the front surface of the semiconductor wafer W may be measured with the upper radiation thermometer 25 when the temperature of the front surface of the semiconductor wafer W is increased and decreased rapidly by the flash heating.

After a predetermined time period has elapsed since the completion of the flash heating treatment, the halogen lamps HL turn off. This causes the temperature of the semiconductor wafer W to decrease rapidly from the preheating temperature T1. The lower radiation thermometer 20 measures the temperature of the semiconductor wafer W which is on the decrease. The result of measurement is transmitted to the controller 3. The controller 3 monitors whether the temperature of the semiconductor wafer W is decreased to a predetermined temperature or not, based on the result of measurement with the lower radiation thermometer 20. After the temperature of the semiconductor wafer W is decreased to the predetermined temperature or below, the pair of transfer arms 11 of the transfer mechanism 10 is moved horizontally again from the retracted position to the transfer operation position and is then moved upwardly, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transport robot outside the heat treatment apparatus 1 transports the semiconductor wafer W placed on the lift pins 12 to the outside. Thus, the heat treatment apparatus 1 completes the heating treatment of the semiconductor wafer W.

Figure 10:
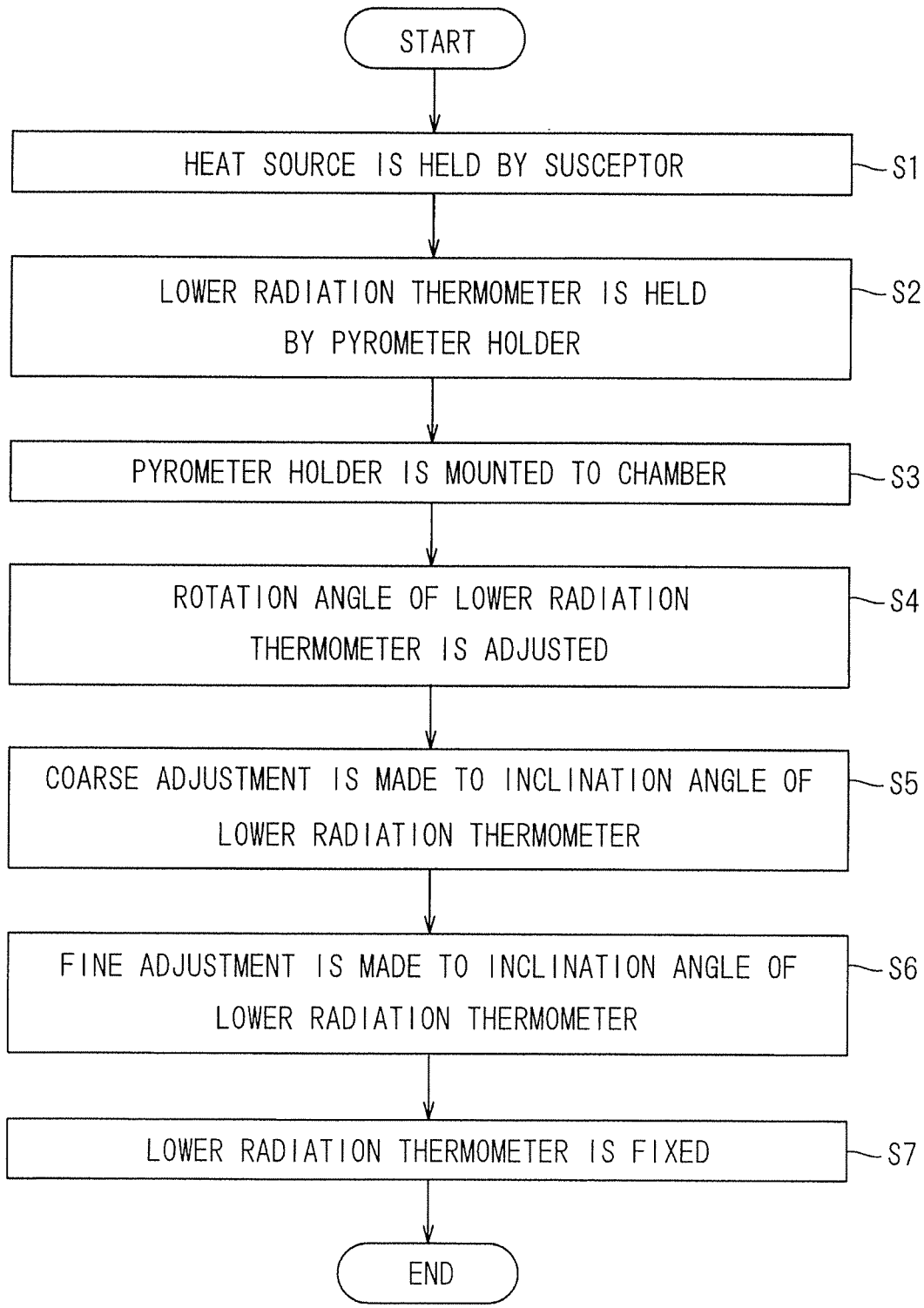
FIG. 10 is a flow diagram showing a procedure for the adjustment of the measurement position of the lower radiation thermometer.

Next, a method of adjusting the measurement position of the lower radiation thermometer 20 which measures the temperature of the lower surface of a semiconductor wafer W will be described. This adjustment of the measurement position is made by an operator when the lower radiation thermometer 20 is mounted to the chamber 6 during maintenance or the like. FIG. 10 is a flow diagram showing a procedure for the adjustment of the measurement position of the lower radiation thermometer 20.

First, a heat source serving as a target of temperature measurement for the adjustment of the measurement position of the lower radiation thermometer 20 is held by the susceptor 74 of the holder 7 (Step S1). FIG. 11 is a schematic view showing a heat source 131 being held by the susceptor 74. To be precise, a plate-like element 130 having the heat source 131 provided in the lower surface thereof is held by the susceptor 74. Like the semiconductor wafer W, the plate-like element 130 is supported by the substrate support pins 77 and held by the susceptor 74. Thus, a predetermined distance is defined between the plate-like element 130 and the holding surface 75a of the holding plate 75. This predetermined distance is equal to the distance defined between the lower surface of the semiconductor wafer W held by the susceptor 74 and the holding surface 75a of the holding plate 75.

The heat source 131 is a planar heater, for example. The temperature of the heat source 131 is increased to 400° C., for example. As shown in FIG. 11, the plate-like element 130 is held by the susceptor 74 so that the heat source 131 falls within the range of the visual field obtained when the lower surface of the plate-like element 130 is viewed from the lower radiation thermometer 20 mounted to the chamber 6 through the opening 78.

Next, the lower radiation thermometer 20 is held by the pyrometer holder 110 (Step S2). Specifically, the cylindrical lower radiation thermometer 20 is inserted through the adjusting ring 121. Then, the front end of the lower radiation thermometer 20 is brought into abutment with the mounting portion 111, and the bottom plate 113 is brought into abutment with the rear end of the lower radiation thermometer 20. The tension spring 112 is tensioned between the bottom plate 113 and the mounting portion 111. At this time, the lower radiation thermometer 20 is held by the pyrometer holder 110 so that the center of the lower radiation thermometer 20 coincides with the center of the adjusting ring 121. The front ends of the first and second knurled bolts 122 and 123 come in contact with the cylindrical side wall surface of the lower radiation thermometer 20, and the side wall surface is pressed by the spring 125 provided between the inner side surface of the adjusting ring 121 and the side wall surface of the lower radiation thermometer 20. The front end of the spring-equipped bolt 124 is spaced apart from the side wall surface of the lower radiation thermometer 20.

Subsequently, the pyrometer holder 110 holding the lower radiation thermometer 20 is mounted to the outer wall of the chamber side portion 61 (Step S3). When the pyrometer holder 110 is mounted to the outer wall of the chamber side portion 61, the optical axis of the lower radiation thermometer 20 approximately coincides with the longitudinal axis of the through hole 61*b* (with reference to FIG. 8). The opening 78 is formed in the position where the longitudinal axis of the through hole 61*b* and the holding plate 75 of the susceptor 74 intersect each other. Thus, the optical axis of the lower radiation thermometer 20 mounted to the chamber 6 passes through the opening 78 of the susceptor 74 and intersects the lower surface of the plate-like element 130. A region of the lower surface of the plate-like element 130 which intersects the optical axis of the lower radiation thermometer 20 is a measurement region of the lower radiation thermometer 20.

FIG. 12 is a view showing a measurement region 22 of the lower radiation thermometer 20 in the lower surface of the plate-like element 130. The measurement region 22 of the lower radiation thermometer 20 in the lower surface of the plate-like element 130 is substantially elliptical in shape because the lower radiation thermometer 20 is provided obliquely below the susceptor 74. The lower radiation thermometer 20 receives infrared radiation emitted from the measurement region 22 to measure the temperature of the measurement region 22. Thus, the coincidence of the measurement region 22 of the lower radiation thermometer 20 with a fixed region in the lower surface of the semiconductor wafer W leads to the adjustment of the measurement position of the lower radiation thermometer 20 to a predetermined position lying within the wafer surface. In the present preferred embodiment, the heat source 131 is provided in the same position as the fixed region in the lower surface of the semiconductor wafer W held by the susceptor 74, and the measurement position of the lower radiation thermometer 20 is adjusted by bringing the measurement region 22 closer to the heat source 131.

After the pyrometer holder 110 holding the lower radiation thermometer 20 is mounted to the outer wall of the chamber side portion 61, the rotation angle of the lower radiation thermometer 20 is adjusted first (Step S4). To be precise, the rotation angle is adjusted by rotating the lower radiation thermometer 20 about the central axis of the cylindrical lower radiation thermometer 20. When the optical axis of the lower radiation thermometer 20 completely coincides with the central axis thereof, the rotation of the lower radiation thermometer 20 exerts no influence upon the measurement region 22. In actuality, there is a slight misalignment between the optical axis of the lower radiation thermometer 20 and the central axis thereof in some cases due to manufacturing errors and the like. In such cases, the rotation of the lower radiation thermometer 20 causes the measurement region 22 to move slightly in the lower surface of the plate-like element 130 held by the susceptor 74. For this reason, the rotation angle of the lower radiation thermometer 20 is adjusted.

Specifically, the lower radiation thermometer 20 is rotated in steps of 45 degrees, for example, about the central axis thereof while the pyrometer holder 110 is fixed. Then, the lower radiation thermometer 20 is rotated to a rotation angle at which the highest temperature is obtained among the temperatures measured at respective rotation angles with the lower radiation thermometer 20. The highest temperature measured with the lower radiation thermometer 20 indicates the highest rate of coincidence between the measurement region 22 and the heat source 131. That is, the lower radiation thermometer 20 is rotated so that the measurement region 22 is closest to the heat source 131.

Next, a coarse adjustment is made to the inclination angle of the lower radiation thermometer 20 with respect to the outer wall of the chamber side portion 61 (Step S5). To be precise, the inclination angle of the lower radiation thermometer 20 with respect to the outer wall of the chamber 6 is adjusted, with the front end of the lower radiation thermometer 20 in abutment with the mounting portion 111 of the pyrometer holder 110 serving as a supporting point. A change in inclination angle of the lower radiation thermometer 20 with respect to the outer wall of the chamber 6 causes a change in angle of the optical axis of the lower radiation thermometer 20 with respect to the plate-like element 130, so that the measurement region 22 is moved in the lower surface of the plate-like element 130.

Specifically, the first knurled bolt 122 of the angle adjusting mechanism 120 is rotated in seven steps of 0.5 turn. The amount of rotation of the first knurled bolt 122 is measurable with the first gauge 126. The first knurled bolt 122 adjusts the inclination angle of the lower radiation thermometer 20 in a horizontal direction. The measurement region 22 moves in the X direction of FIG. 12 in the lower surface of the plate-like element 130 as the lower radiation thermometer 20 is pivoted in a horizontal direction by the first knurled bolt 122, with the front end of the lower radiation thermometer 20 serving as the supporting point.

For each of the seven steps of 0.5 turn of the first knurled bolt 122, the second knurled bolt 123 is rotated in seven steps of 0.5 turn. The amount of rotation of the second knurled bolt 123 is measurable with the second gauge 127. The second knurled bolt 123 adjusts the inclination angle of the lower radiation thermometer 20 in a vertical direction. The measurement region 22 moves in the Y direction of FIG. 12 in the lower surface of the plate-like element 130 as the lower radiation thermometer 20 is pivoted in a vertical direction by the second knurled bolt 123, with the front end of the lower radiation thermometer 20 serving as the supporting point. While the inclination angle of the lower radiation thermometer 20 is adjusted by the rotation of the first knurled bolt 122 and the second knurled bolt 123, the spring 125 continues pressing the side wall surface of the lower radiation thermometer 20 toward the first knurled bolt 122 and the second knurled bolt 123. Thus, unintended movement of the lower radiation thermometer 20 is restricted although the inclination angle of the lower radiation thermometer 20 can be changed by the rotation of the first knurled bolt 122 and the second knurled bolt 123.

The rotation of the second knurled bolt 123 in seven steps for each of the seven steps of rotation of the first knurled bolt 122 results in the movement of the measurement region 22 in 49 steps in the X and Y directions in the lower surface of the plate-like element 130. The lower radiation thermometer 20 measures the temperature in each of the steps of movement of the measurement region 22 to acquire temperature measurement data at 49 points. As mentioned above, the measurement position of the lower radiation thermometer 20 is adjusted so that the measurement region 22 is closer to the heat source 131. Thus, the first knurled bolt 122 and the second knurled bolt 123 are rotated to the amounts of rotation corresponding to the step where the highest temperature is measured among the temperature measurement data at 49 points.

Subsequently, a fine adjustment is made to the inclination angle of the lower radiation thermometer 20 (Step S6). Specifically, after the first knurled bolt 122 and the second knurled bolt 123 are rotated to the amounts of rotation determined by the aforementioned coarse adjustment, the first knurled bolt 122 and the second knurled bolt 123 are rotated a small amount (for example, 0.25 turn), so that the temperature measured with the lower radiation thermometer 20 reaches the highest temperature. This allows the measurement region 22 to be closest to the heat source 131, thereby adjusting the measurement position of the lower radiation thermometer 20 precisely to the predetermined position lying in the lower surface of the semiconductor wafer W.

After the final amounts of rotation of the first knurled bolt 122 and the second knurled bolt 123 are determined and the angle adjustments are completed, the spring-equipped bolt 124 is rotated so that the front end (bolt portion) thereof is brought into abutment with the side wall surface of the lower radiation thermometer 20, whereby the lower radiation thermometer 20 is fixed (Step S7). Thus, the lower radiation thermometer 20 is supported and fixed at three points by the first knurled bolt 122, the second knurled bolt 123 and the spring-equipped bolt 124, with the measurement position of the lower radiation thermometer 20 adjusted to the predetermined position lying in the lower surface of the semiconductor wafer W.

In the present preferred embodiment, the lower radiation thermometer 20 is mounted to the chamber 6 by mounting the pyrometer holder 110 holding the lower radiation thermometer 20 to the outer wall of the chamber 6. Then, the measurement position of the lower radiation thermometer 20 is adjusted using the angle adjusting mechanism 120 provided in the pyrometer holder 110 and the like. This allows the measurement position of the lower radiation thermometer 20 to be precisely adjusted to the predetermined position lying within the surface of the semiconductor wafer W, and also allows the measurement position to be returned to its original position with good reproducibility by adjusting the measurement position of the lower radiation thermometer 20 in accordance with the same procedure even if the lower radiation thermometer 20 is removed once and then mounted again. For example, when two or more heat treatment apparatuses 1 are installed in a factory, the adjustment of the measurement position of the lower radiation thermometer 20 in accordance with the same procedure minimizes a difference between the two or more heat treatment apparatuses 1. The lower radiation thermometer 20 may be removed together with the pyrometer holder 110 from the chamber 6 or may be removed alone from the pyrometer holder 110.

The adjusting ring 121 of the angle adjusting mechanism 120 is provided so as to surround part of the side wall surface which is closer to the rear end of the lower radiation thermometer 20 with respect to the longitudinal midpoint of the cylindrical lower radiation thermometer 20. This makes it relatively easy to adjust the inclination angle by means of the angle adjusting mechanism 120, with the front end of the lower radiation thermometer 20 serving as the supporting point. In addition, this increases stability when the lower radiation thermometer 20 is supported at three points by the first knurled bolt 122, the second knurled bolt 123 and the spring-equipped bolt 124 after the adjustment of the measurement position.

The tension spring 112 pressing the lower radiation thermometer 20 against the pyrometer holder 110 from the rear end of the lower radiation thermometer 20 toward the front end thereof prevents the lower radiation thermometer 20 from falling off or misregistration.

The first gauge 126 and the second gauge 127 are provided in the angle adjusting mechanism 120 to thereby measure the amounts of rotation of the first knurled bolt 122 and the second knurled bolt 123. Specifically, the first gauge 126 measures the amount of angle adjustment in the horizontal direction of the lower radiation thermometer 20 by means of the first knurled bolt 122. The second gauge 127 measures the amount of angle adjustment in the vertical direction of the lower radiation thermometer 20 by means of the second knurled bolt 123. As a result, the measurement position of the lower radiation thermometer 20 by means of the first knurled bolt 122 and the second knurled bolt 123 is quantified. Thus, the measurement position of the lower radiation thermometer 20 is adjusted with good reproducibility independently of the experience and ability of the operator.

In the present preferred embodiment, the lower radiation thermometer 20 is provided obliquely below the semiconductor wafer W held by the susceptor 74. If the lower radiation thermometer 20 is provided immediately under the semiconductor wafer W perpendicularly to the wafer surface, the angle formed between the optical axis of the lower radiation thermometer 20 and the main surface of the semiconductor wafer W is 90 degrees. On the other hand, the lower radiation thermometer 20 provided obliquely below the semiconductor wafer W produces an angle of less than 90 degrees formed between the optical axis of the lower radiation thermometer 20 and the main surface of the semiconductor wafer W.

Figure 13:
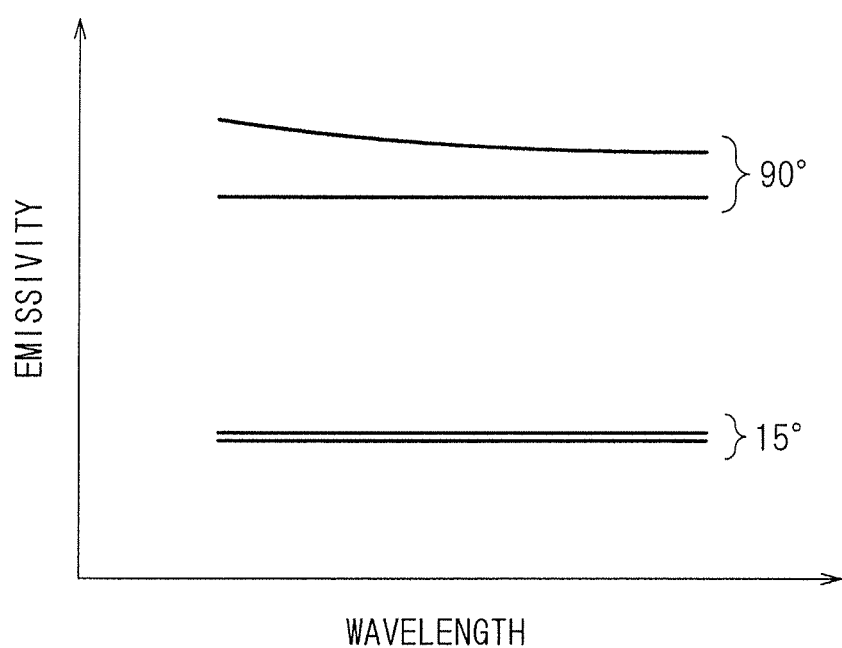
FIG. 13 is a graph showing the influence of an angle formed between the optical axis of the lower radiation thermometer and a main surface of a semiconductor wafer upon the apparent emissivity of the semiconductor wafer.

FIG. 13 is a graph showing the influence of the angle formed between the optical axis of the lower radiation thermometer 20 and the main surface of the semiconductor wafer W upon the apparent emissivity of the semiconductor wafer W. The apparent emissivity obtained when two types of thin films having different thicknesses are formed on the lower surface of the semiconductor wafer W and the angle formed between the optical axis of the lower radiation thermometer 20 and the main surface of the semiconductor wafer W is 15 degrees and 90 degrees is shown in FIG. 13. The apparent emissivity of the semiconductor wafer W in the wavelength range measurable with the lower radiation thermometer 20 is also shown in FIG. 13.

As shown in FIG. 13, when the angle formed between the optical axis of the lower radiation thermometer 20 and the main surface of the semiconductor wafer W is 90 degrees, the apparent emissivity of the semiconductor wafer W is highly dependent on the thickness and type of the thin films formed on the lower surface of the semiconductor wafer W. On the other hand, when the angle formed between the optical axis of the lower radiation thermometer 20 and the main surface of the semiconductor wafer W is 15 degrees, the apparent emissivity of the semiconductor wafer W is virtually independent of the thickness and type of the thin films formed on the lower surface of the semiconductor wafer W. That is, the lower radiation thermometer 20 provided obliquely below the semiconductor wafer W reduces the influence of the thickness and type of the thin films formed on the semiconductor wafer W upon the emissivity of the semiconductor wafer W to eliminate the need for strict emissivity adjustment for each semiconductor wafer W.

While the preferred embodiment according to the present invention has been described hereinabove, various modifications of the present invention in addition to those described above may be made without departing from the scope and spirit of the invention. For example, the measurement position of the lower radiation thermometer 20 is adjusted in the aforementioned preferred embodiment. However, the measurement position of the upper radiation thermometer 25 may also be adjusted in the same manner by making the upper radiation thermometer 25 similar in configuration to the lower radiation thermometer 20.

Each of the first knurled bolt 122 and the second knurled bolt 123 is rotated in seven steps during the adjustment of the inclination angle of the lower radiation thermometer 20 in the aforementioned preferred embodiment. The present invention, however, is not limited to this. The amounts of rotation of the first knurled bolt 122 and the second knurled bolt 123 may be in multiple steps as appropriate.

Although the 30 flash lamps FL are provided in the flash heating part 5 according to the aforementioned preferred embodiment, the present invention is not limited to this. Any number of flash lamps FL may be provided. The flash lamps FL are not limited to the xenon flash lamps, but may be krypton flash lamps. Also, the number of halogen lamps HL provided in the halogen heating part 4 is not limited to 40. Any number of halogen lamps HL may be provided.

In the aforementioned preferred embodiment, the filament-type halogen lamps HL are used as continuous lighting lamps that emit light continuously for not less than one second to preheat the semiconductor wafer W. The present invention, however, is not limited to this. In place of the halogen lamps HL, discharge type arc lamps may be used as continuous lighting lamps to preheat the semiconductor wafer W.

Moreover, a substrate to be treated by the heat treatment apparatus 1 is not limited to a semiconductor wafer, but may be a glass substrate for use in a flat panel display for a liquid crystal display apparatus and the like, and a substrate for a solar cell. Also, the technique according to the present invention may be applied to the heat treatment of high dielectric constant gate insulator films (high-k films), to the joining of metal and silicon, and to the crystallization of polysilicon.

While the invention has been described in detail, the foregoing description is in all aspects illustrative and not restrictive. It is understood that numerous other modifications and variations can be devised without departing from the scope of the invention.

What is claimed is:

1. A heat treatment apparatus for heating a substrate by irradiating the substrate with light, comprising:
    a chamber for receiving a substrate therein;
    a light source for irradiating said substrate received in said chamber with light;
    a radiation thermometer of a cylindrical shape for receiving infrared radiation emitted from said substrate to measure a temperature of said substrate;
    a holder mounted to an outer wall of said chamber while holding said radiation thermometer; and
    a measurement position adjusting mechanism provided in said holder and for adjusting the measurement position of said radiation thermometer on said substrate,
    wherein said measurement position adjusting mechanism includes an angle adjusting mechanism for adjusting the angle of said radiation thermometer with respect to the outer wall of said chamber, with a front end of said radiation thermometer serving as a supporting point,
    wherein said angle adjusting mechanism includes
        a first bolt in abutment with a side wall surface of said radiation thermometer and for adjusting the angle of said radiation thermometer in a first direction,
        a second bolt in abutment with the side wall surface of said radiation thermometer and for adjusting the angle of said radiation thermometer in a second direction perpendicular to said first direction, and
        a spring-equipped bolt provided so as to extend in a third direction that forms an angle of 135 degrees with said first direction and with said second direction,
    wherein a spring portion of said spring-equipped bolt presses the side wall surface of said radiation thermometer when said first bolt and said second bolt adjust the angle of said radiation thermometer; and
    wherein a bolt portion of said spring-equipped bolt abuts against the side wall surface of said radiation thermometer to fix said radiation thermometer when the adjustment of the angle of said radiation thermometer by means of said first bolt and said second bolt is completed.

2. The heat treatment apparatus according to claim 1, wherein
    said angle adjusting mechanism further includes
    a first gauge indicating an amount of angle adjustment of said radiation thermometer by means of said first bolt, and
    a second gauge indicating an amount of angle adjustment of said radiation thermometer by means of said second bolt.

3. The heat treatment apparatus according to claim 1, wherein
    said holder includes a tension spring for pressing said radiation thermometer against said holder from a rear end of said radiation thermometer toward the front end thereof.

4. The heat treatment apparatus according to claim 1,
    wherein said substrate in said chamber is held by a susceptor made of quartz and having an opening formed therein for allowing infrared radiation emitted from the lower surface of said substrate to pass therethrough, and
    wherein said radiation thermometer is provided obliquely below said substrate to receive said infrared radiation having passed through said opening.

5. A method of adjusting a measurement position of a radiation thermometer of a cylindrical shape for measuring a temperature of a substrate received in a chamber and subjected to heating by irradiation with light, said method comprising the steps of:
    (a) mounting a holder holding said radiation thermometer to an outer wall of said chamber; and
    (b) adjusting an angle of said radiation thermometer, with a front end of said radiation thermometer serving as a supporting point, to thereby adjust the measurement position of said radiation thermometer on said substrate,
    wherein said step (b) includes the steps of:
        (b-1) adjusting a rotation angle of said radiation thermometer about an axis of said radiation thermometer; and
        (b-2) adjusting an inclination angle of said radiation thermometer with respect to the outer wall of said chamber, wherein said step (b-2) includes the steps of:
- (b-2-1) adjusting the angle of said radiation thermometer in a first direction with respect to a side wall surface of said radiation thermometer; and
- (b-2-2) adjusting the angle of said radiation thermometer in a second direction perpendicular to said first direction with respect to the side wall surface of said radiation thermometer.

6. The method according to claim 5, wherein said substrate in said chamber is held by a susceptor made of quartz and having an opening formed therein for allowing infrared radiation emitted from the lower surface of said substrate to pass therethrough, and wherein said radiation thermometer is provided obliquely below said substrate to receive said infrared radiation having passed through said opening.

\* \* \* \* \*